(12) United States Patent
Ishikawa

(10) Patent No.: US 6,373,775 B2
(45) Date of Patent: Apr. 16, 2002

(54) SEMICONDUCTOR MEMORY DEVICE WITH RESTRAINED SCALE OF DECODING CIRCUIT USED IN SHIFT REDUNDANCY

(75) Inventor: Masatoshi Ishikawa, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/784,135

(22) Filed: Feb. 16, 2001

(30) Foreign Application Priority Data

Mar. 13, 2000 (JP) ........................................ 2000-068360

(51) Int. Cl.[7] ................................................ G11C 7/00
(52) U.S. Cl. ............................. 365/230.03; 365/230.06
(58) Field of Search ..................... 365/230.03, 230.06, 365/225.7, 200

(56) References Cited

U.S. PATENT DOCUMENTS 5,499,215 A * 3/1996 Hatta ..................... 365/230.03
6,151,263 A 11/2000 Kyung et al. ........... 365/230.03

FOREIGN PATENT DOCUMENTS

| JP | 8-8344 | 1/1996 |
| JP | 11-176187 | 7/1999 |

OTHER PUBLICATIONS

"Dynamically Shift–Switched Dataline Redundancy Suitable for DRAM Macro with Wide Data Bus", T. Namekawa et al., 1999 Symposium on VLSI Circuits Digest of Technical Papers, pp. 149–152.

* cited by examiner

*Primary Examiner*—Vu A. Le
(74) *Attorney, Agent, or Firm*—McDermott, Will & Emery

(57) ABSTRACT

Shift switches are divided into a plurality of shift switch groups each having the same number of shift switches. The connection direction of each shift switch is switched at the shift switch corresponding to the shift position. The designation of the shift position is carried out by decoding an upper predecoding signal for designating what shift switch group the shift switch corresponding to the shift position belongs to and a lower predecoding signal for designating where the shift switch corresponding to the shift position is located in the shift switches belonging to the same shift switch group. Since the lower predecoding signal can be used as a common signal for each shift switch group, the scale of the decoding circuit for decoding the designation of the shift position can be restrained.

11 Claims, 17 Drawing Sheets

*FIG.13*

| ISAD | | | IFHIN | | | | | | |
|---|---|---|---|---|---|---|---|---|---|
| ⟨5⟩ | ⟨4⟩ | ⟨3⟩ | ⟨6⟩ | ⟨5⟩ | ⟨4⟩ | ⟨3⟩ | ⟨2⟩ | ⟨1⟩ | ⟨0⟩ |
| 0 | 0 | 0 | 1 | 1 | 1 | 1 | 1 | 1 | 1 |
| 0 | 0 | 1 | 1 | 1 | 1 | 1 | 1 | 1 | 0 |
| 0 | 1 | 0 | 1 | 1 | 1 | 1 | 1 | 0 | 0 |
| 0 | 1 | 1 | 1 | 1 | 1 | 1 | 0 | 0 | 0 |
| 1 | 0 | 0 | 1 | 1 | 1 | 0 | 0 | 0 | 0 |
| 1 | 0 | 1 | 1 | 1 | 0 | 0 | 0 | 0 | 0 |
| 1 | 1 | 0 | 1 | 0 | 0 | 0 | 0 | 0 | 0 |
| 1 | 1 | 1 | 0 | 0 | 0 | 0 | 0 | 0 | 0 |

0 : FUSE NOT BLOWN OFF
1 : FUSE BLOWN OFF

FIG.18

| I/O | EIO0 | | | ... | EIO63 |
|---|---|---|---|---|---|
| FH⟨7:0⟩ | FH⟨0⟩=1 (FIXED) | FH⟨1⟩=1 (IFH⟨0⟩) | FH⟨2⟩=1 (IFH⟨1⟩) | FH⟨3⟩=0 (IFH⟨2⟩) | ... | FH⟨7⟩=0 (IFH⟨6⟩) |
| FHM⟨7:0⟩ | FHM⟨0⟩=1 (IFH⟨0⟩) | FHM⟨1⟩=1 (IFH⟨1⟩) | FHM⟨2⟩=0 (IFH⟨2⟩) | FHM⟨3⟩=0 (IFH⟨3⟩) | ... | FHM⟨7⟩=0 (FIXED) |
| FL⟨7:0⟩ | 11110000 | 11110000 | 11110000 | 11110000 | ... | 11110000 |
| IS⟨63:0⟩ | 00000000 | 00000000 | 00001111 | 11111111 | ... | 11111111 |

IS⟨0⟩    IS⟨20⟩    IS⟨63⟩

SEMICONDUCTOR MEMORY DEVICE WITH RESTRAINED SCALE OF DECODING CIRCUIT USED IN SHIFT REDUNDANCY

BACKGROUND OF THE INVENTION

1. Field of the Invention

The present invention relates to a semiconductor memory device, and more particularly to a semiconductor device that performs redundancy relief of a defective memory cell by the shift redundancy method.

2. Description of the Background Art

In order to realize a wide memory band width required by some applications such as image processing, a memory device having numerous data I/O lines is developed beginning with a mixed DRAM/logic mounted memory in which a logic circuit and a memory device are mounted on one and the same chip. In such a memory cell array configuration having numerous data I/O lines, the shift redundancy method is used as a redundancy relief method for performing substitution of a defective memory cell.

FIGS. 19A and 19B are schematic diagrams describing the substitution of a defective memory cell by the shift redundancy method. FIG. 19A shows a connection state of the data I/O lines in the case where the normal memory cell array is free from defects.

Referring to FIG. 19A, a group of normal I/O lines NIOs are provided in correspondence with a normal memory cell array, and spare I/O lines SIO1 and SIO2 are provided in correspondence with a spare memory cell array for redundancy relief. The NIOs, SIO1, and SIO2 that transmit data input into and output from these inner memory cell array are connected to a group of external I/O lines EIOs that are capable of communicating data to and from the outside via a selector circuit 510.

If the normal memory cell array is free from defects, there is no need to perform redundancy relief with the use of the spare memory cell array, so that the normal I/O lines NIOs and the external I/O lines EIOs are connected by the selector circuit 510. On the other hand, the spare I/O lines SIO1 and SIO2 are not connected with the external I/O lines EIOs.

FIG. 19B shows a connection state of the data I/O lines in the case where the normal memory cell array has a defect.

Referring to FIG. 19B, it is assumed that, in the normal memory cell array, regions corresponding to the normal I/O lines NB1 and NB2 marked with the symbol "×" have a defective memory cell. In this case, the defective memory cell is relieved by performing the redundancy relief in a unit of one I/O line. In other words, by switching the connection mode between the group of I/O lines on the inner side and the group of external I/O lines with the use of the selector circuit 510, the data input/output is performed on the spare memory cell array, by accessing the spare I/O lines instead of accessing the normal I/O lines corresponding to the regions having a defective memory cell.

Thus, in the shift redundancy method, even in the case where the normal memory cell array part has a defective memory cell, the spare memory cell array is also accessed routinely, and at the stage of giving and receiving data to and from the external I/O lines, the switching mode among the data I/O lines in the selector circuit 510 is switched so as to substitute for the defective memory cells on the basis of information that is programmed in advance.

Therefore, the redundancy relief can be carried out at a high speed without causing any loss of access time necessary for the determination of redundancy by address comparison.

However, the shift redundancy method requires a shift switch for switching connection of each data I/O line and a decoding circuit for designating the connection mode in each switch by decoding the information programmed in advance.

For this reason, in a configuration where numerous data I/O lines are provided, the increase in the circuit area brought about by the decoding circuit cannot be ignored.

In order to solve these problems, a technique for simplifying the configuration of the decoding circuit of the shift switch in the shift redundancy method is disclosed, for example, in "Dynamically Shift-Switched Dataline Redundancy Suitable for DRAM Macro with Wide Data Bus", Namekawa et al., 1999 Symposium on VLSI Circuits Digest of Technical Papers, pp. 149–152 (hereafter referred to as prior art).

FIG. 20 is a diagram related to the control of the shift switch in the shift redundancy method according to the prior art.

FIG. 20 shows a shift switch SFW for one I/O line and comparators CMP1 and CMP2 for controlling the connection mode of the shift switch SFW. Each of DQ0 to DQ2 is one of 128 DQs.

Referring to FIG. 20, the DQ address for indicating the I/O line number to which each shift switch SFW corresponds is set in advance by a wired logic.

In the shift redundancy method in accordance with the prior art, the shift switch corresponding to the I/O line having a defective memory cell is designated to be a shift position, and by utilizing the fact that the connection direction of each shift switch is the same in each of the right/left regions separated at the shift switch corresponding to the shift position, the connection direction in each shift switch is set by comparing the DQ address of its own and the DQ address designated to be the shift position in each shift switch instead of decoding the connection direction for each shift switch.

The comparators CMP1 and CMP2 compare the positional relationship between the DQ address and the predecoding signals Z1 and Z2 for designating the DQ address corresponding to the shift position, and determines which of the right/left regions of the shift position the corresponding shift switch SFW belongs, thereby to set the connection direction of the shift switch SFW.

This eliminates the need for instructing the connection direction for each shift switch, so that the number of bits in the predecoding signal can be reduced, and the configuration of the comparators CMP1 and CMP2 can be simplified.

Thus, the prior art aims at simplification of the decoding circuit, i.e. the comparators CMP1 and CMP2, by utilizing the fact that the connection direction of the shift switch changes uniformly at the shift position. However, in accordance with the recent development of image processing technique and others, a wider data I/O width is demanded in increasing number of cases, so that a further simplification of the decoding circuit of the shift switch in the shift redundancy method is an important goal to be achieved.

SUMMARY OF THE INVENTION

The present invention provides a configuration of a semiconductor memory device that can reduce the area of the decoding circuit for setting the connection direction of the shift switch used in the shift redundancy method.

In summary, the present invention is directed to a semiconductor memory device including a memory cell array, a plurality of internal data lines, a plurality of external data lines, a plurality of shift switches, and a shift control circuit.

The memory cell array includes a normal memory array part and a spare array part disposed adjacent to the normal memory array part for substitution of a defective part in the normal memory array. The plurality of internal data lines transmit data input and output to and from the memory cell array part. The plurality of internal data lines include a plurality of normal data lines from the first one to the M-th one (M: natural number) disposed in correspondence with the normal memory array part, and a spare data line disposed in correspondence with the spare array part. The plurality of external data lines are capable of giving and receiving data to and from the outside, and consist of M lines from the first one to the M-th one. The plurality of shift switches are disposed in correspondence with the plurality of external data lines, respectively. The shift switches are each disposed between adjacent two lines in the plurality of internal data lines, and connect the corresponding external data line to either one of the adjacent two internal data lines in accordance with the instructed connection direction. The shift control circuit sets the connection direction of each shift switch on the basis of information on a shift position stored in advance in carrying out the substitution of the defective part by the spare array part. The shift control circuit includes a shift position predecoding circuit that generates a first predecoding signal for designating one group containing the shift switch corresponding to the shift position among the L groups (L: natural number represented by M/N) formed by dividing the M shift switches into groups each containing N switches (N: natural number being a divisor of M and smaller than M) and a second predecoding signal commonly provided for each group and designating the N'-th one (N': natural number from 1 to N) of the N shift switches belonging to the same group, and a shift position decoding circuit that sets the connection direction of each shift switch on the basis of the first and second predecoding signals.

Therefore, the principal advantage of the present invention lies in that the plurality of shift switches are divided into L groups, and the designation of the shift switch corresponding to the shift position is carried out on the basis of the first predecoding signal for designating one group among the L groups and the second predecoding signal for designating the N'-th one of the N switches belonging to the same group; and, since the second predecoding signal can be used in common for each group by allowing the number of shift switches contained in each group to be the same, the number of transistors constituting the shift position decoding circuit can be reduced The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a view showing a signal level of each bit in a predecoding signal corresponding to a combination of 3-bit shift address bits;

FIG. 18 is a table related to the decoding of a shift position and a connection direction of each shift switch;

DESCRIPTION OF THE PREFERRED EMBODIMENTS

Hereafter, embodiments of the present invention will be described in detail with reference to the attached drawings.

Figure 1:
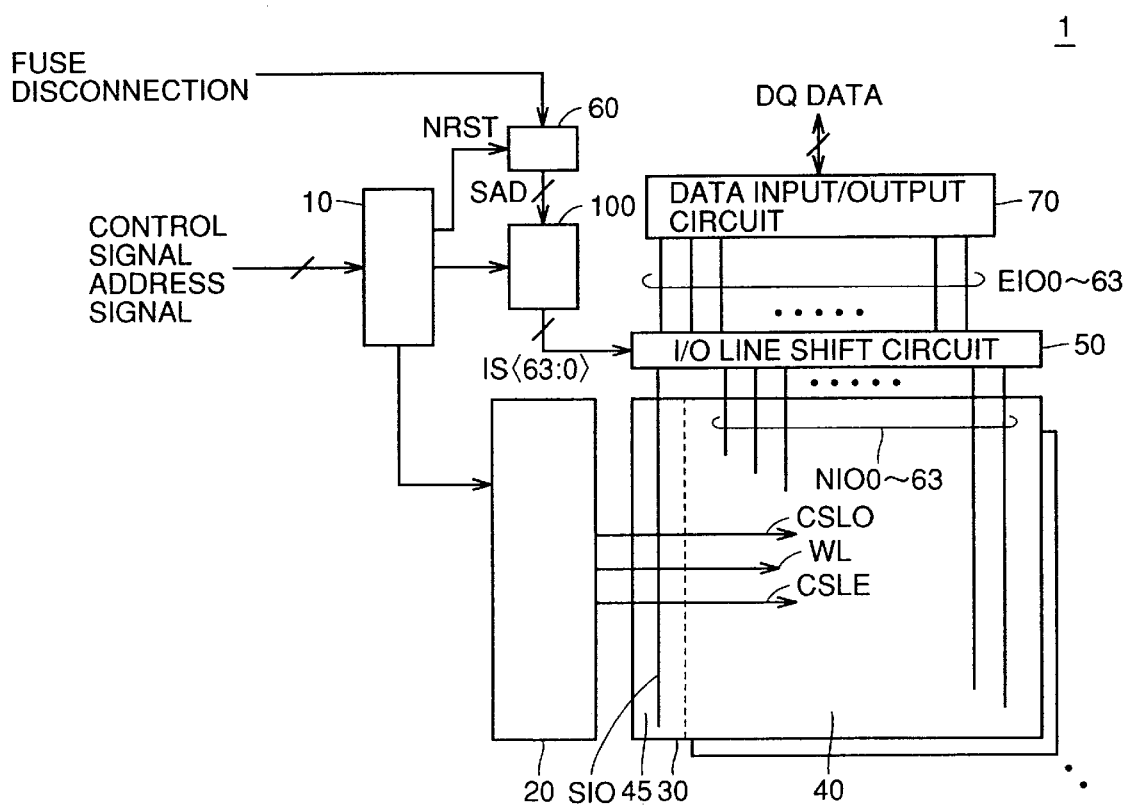
FIG. 1 is a schematic block diagram showing an overall configuration of a semiconductor memory device 1 according to an embodiment of the present invention.

Referring to FIG. 1, a semiconductor memory device 1 according to the present invention includes a control circuit 10 for controlling the operation of the semiconductor memory device 1 as a whole by receiving a control signal and an address signal from the outside, a memory mat 30 having a plurality of memory cells arranged in a matrix, and a WL/CSL driving circuit 20 that performs selective activation of a word line and a column selection line in the memory mat 30 in accordance with the address signal.

The semiconductor memory device 1 includes at least one memory mat 30. FIG. 1 illustrates the arrangement of a group of circuits for a single memory mat 30 and a connection mode between these circuits. However, it is possible to adopt a configuration having a plurality of memory mats of a similar configuration. In this case, layout area can be saved if the plurality of memory mats 30 are arranged to be symmetric with respect to the region where the control circuit 10 and the WL/CSL driving circuit 20 are disposed.

The memory mat 30 includes a normal memory array part 40 and a spare memory array part 45. In the normal memory array part 40, there are disposed sixty-four normal I/O lines NIO0 to NIO63. In the spare memory array part 45, there is disposed a spare I/O line SIO. These normal I/O lines NIO0 to NIO63 and the spare I/O line SIO arranged in correspondence with the memory mat 30 are generally referred to also as internal I/O lines.

The (64+1) internal I/O lines are connected to external I/O lines EIO0 to EIO63 via an I/O line shift circuit 50. The data transmitted to the external I/O lines are given and received as DQ data to and from the outside via a data input/output circuit 70.

Figure 2:
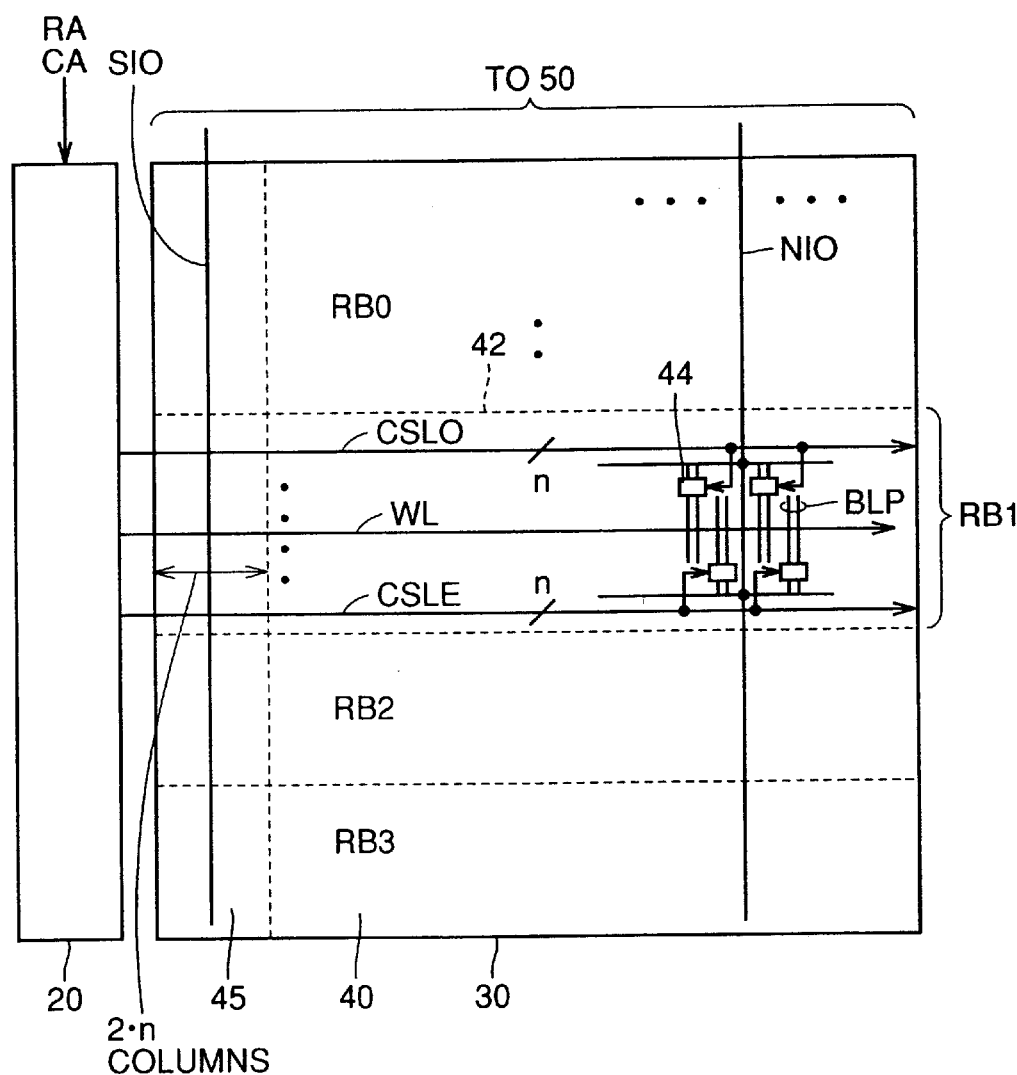
FIG. 2 is a block diagram showing a configuration of a memory mat 30.

Referring to FIG. 2, the memory mat 30 is divided into a plurality of row blocks along the row direction. FIG. 2 shows a case in which the memory mat 30 is divided into four row blocks RB0 to RB3.

In the memory mat 30, a word line WL is provided for each memory cell row. The word line WL is selectively activated in accordance with a row address RA input into the WL/CSL driving circuit 20. A bit line pair BLP is provided independently for each row block and in correspondence with each memory cell column. In each row block, the bit line pair BLP and a sense amplifier and writing selector circuit 44 for executing data input/output between the normal I/O line NIO and the bit line pair BLP are disposed for each memory cell column.

One normal I/O line NIO is disposed for every 2·n memory cell columns (n: natural number). In response to the row address CA input into the WL/CSL driving circuit 20, column selection of n:1 is executed in response to a column selection signal transmitted by the column selection line CSLO for odd-numbered memory cell columns, and column selection of n:1 is executed in response to a column selection signal transmitted by the column selection line CSLE for even-numbered memory cell columns. In other words, the column selection in the memory mat 30 is executed independently in the odd-numbered memory cell columns and the even-numbered memory cell columns. The activated bit line pair in the normal memory array part 40 is connected to the normal I/O line NIO.

In this way, the normal memory array part 40 is equivalently divided into 4×2=8 regions in accordance with the row address and the column address. Hereafter, these regions may also simply referred to as memory blocks.

The spare memory array part 45 is disposed adjacent to the normal memory array part 40 in the row direction. The spare memory array part 45 has 2·n memory cell columns, and the row selection and the column selection are carried out by the same word line WL and column selection lines CSLE, CSLO as in the normal array 40. The activated bit line pair in the spare memory array part 45 is connected to the spare I/O line SIO.

By adopting such a configuration, the spare array 45 allows substitution of the normal I/O line NIO with the spare I/O line SIO in a unit of one I/O line for each memory block. In other words, in the embodiment of the present invention, a pattern for substitution and relief can be programmed for each memory block.

The example of FIG. 2 shows a configuration in which the memory cell columns are divided into odd-numbered columns and even-numbered columns. However, for division of the memory cell columns, it is possible to adopt other methods. As an example, it is possible to adopt a configuration in which the normal I/O line NIO is disposed at the center of the 2·n memory cell columns corresponding thereto to divide the whole memory cell columns into those located on the right side and those located on the left side of the normal I/O line NIO so as to allow them to correspond to the column selection lines CSLO and CSLE, respectively. In this case, the column selection of n:1 for the group of memory cell columns located on the left side of the normal I/O line NIO may be executed by the column selection line CSLO, and the column selection of n:1 for the group of memory cell columns located on the right side of the normal I/O line NIO may be executed by the column selection line CSLE. By adopting such a configuration, the same substitution and relief pattern can be used in inputting and outputting data of consecutive plural bits (not more than n bits) that follow, for example, the burst mode, so as to reduce power consumption.

Here, in this embodiment, the configuration in which the normal memory array part 40 is divided into 8 memory blocks and sixty-four normal I/O lines are provided in correspondence with the normal memory array part 40 is merely an example, and the number of memory blocks and the number of normal I/O lines can be determined as needed.

Figures 3, 4:
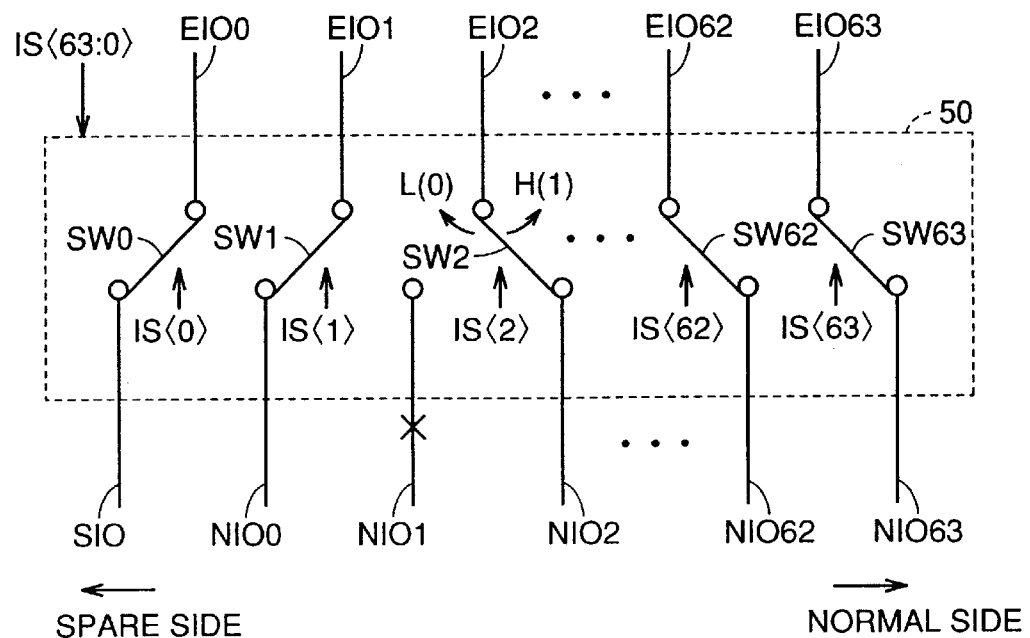
FIG. 3 is a diagram illustrating a configuration of an I/O line shift circuit in detail.
FIG. 4 is a diagram illustrating a decoding method of a shift position according to the embodiment of the present invention.

Referring to FIG. 3, the I/O line shift circuit 50 includes shift switches SW0 to SW63 disposed in correspondence with the external I/O lines EIO0 to EIO63, respectively. The connection directions of the shift switches SW0 to SW63 are controlled by shift setting signals IS<0> to IS<63>, respectively. Hereafter, the shift setting signals IS<0> to IS<63> may also generally referred to as IS<63:0>.

Each shift switch is disposed between adjacent two internal I/O lines, and connects the corresponding external I/O line with either one of the adjacent two internal I/O lines. In FIG. 3, the spare I/O line SIO is disposed on the leftmost side, so that with respect to the connection direction of each shift switch, the side on which the spare I/O line SIO is disposed will also be hereafter referred to as the spare side (the left side in FIG. 3), and the side opposite thereto will also be referred to as the normal side (the right side in FIG. 3).

The connection direction of each shift switch is set to the normal side if the signal level of the corresponding shift setting signal is an H-level ("1"), and is set to the spare side if it is an L-level ("0").

If the redundancy relief by the spare memory array part is unnecessary, the connection direction of each shift switch is set to the normal side, whereby the external I/O lines EIO0 to EIO63 are connected to the normal I/O lines NIO0 to NIO63, respectively.

On the other hand, if a defective memory cell is present in the normal memory array and the redundancy relief is needed, the shift switch corresponding to the normal I/O line connected to the defective memory cell is designated as the shift position. For example, if the normal I/O line NIO1 is connected to the defective cell as shown in FIG. 3, the shift switch SW1 is designated as the shift position, and the connection direction of the shift switches SW0 and SW1 located subsequent to the shift position is switched from the normal side to the spare side.

This allows switching of the connection direction of the external I/O lines EIO0 and EIO1 to connect them to the spare I/O line SIO and the normal I/O line NIO0, respectively. In this case, the shift setting signals IS<0> and IS<1> corresponding to the shift switches located on the left side of the shift position are set at the L-level ("0"), and the shift setting signals IS<2> to IS<63> corresponding to the group of shift switches located on the right side (normal side) of the shift position are set at the H-level ("1").

Thus, the I/O line shift circuit 50 has sixty-four shift switches, and the substitution of the defective memory cell is carried out by switching, at the shift position, the connection direction between the external I/O line and the internal I/O line in each shift switch. At this time, each of the shift setting signals IS<63:0> changes its signal level at the place corresponding to the shift switch corresponding to the shift position.

Referring to FIG. 4, the present invention is characterized in that the shift position is designated by a hierarchically provided predecoding signal in selecting one shift switch corresponding to the shift position from a plurality of shift switches contained in the I/O line shift circuit 50.

The group of sixty-four shift switches SW0 to SW63 shown in FIG. 3 are divided into eight shift switch groups GR0 to GR7. Each shift switch group contains eight shift switches.

The upper predecoding signal FH is a predecoding signal for designating which shift switch group the shift switch corresponding to the shift position belongs to. Since one of the eight shift switch groups is designated in this embodiment, it is sufficient to execute a predecoding operation based on a 3-bit signal.

Further, the lower predecoding signal FL is provided for designating what position the shift switch corresponding to the shift position is located in the shift switches belonging to the same shift switch group. By allowing the same number of switches to be contained in each shift switch group, the lower predecoding signal FL can be a signal common to each shift switch group. In this embodiment, it is sufficient to execute a predecoding operation based on a 3-bit signal in order to designate one of the eight shift switches in the same shift switch group.

For example, if the shift switch SW1 is designated as the shift position as shown in FIG. 3, it is sufficient if the upper predecoding signal FH designates the shift switch group GR0 and the lower predecoding signal FL designates that the second shift switch in the shift switch group corresponds to the shift position. Thus, by a combination of the upper predecoding signal FH and the lower predecoding signal FL, one shift switch corresponding to the shift position can be designated from the whole shift switches.

Among the shift setting signals IS<63:0>, the signals corresponding to the group of shift switches located on the spare side including the shift position are set at the L-level ("0"), and the signals corresponding to the group of the rest of the switches are set at the H-level ("1").

Referring again to FIG. 1, the semiconductor memory device 1 further includes fuse program circuits 60 for storing the shift position of the I/O line for executing the redundancy relief as program information, and a shift control circuit 100 that generates the shift setting signals IS<63:0> on the basis of a shift address signal SAD generated on the basis of the program information in response to a shift reset signal NRST.

Figure 5:
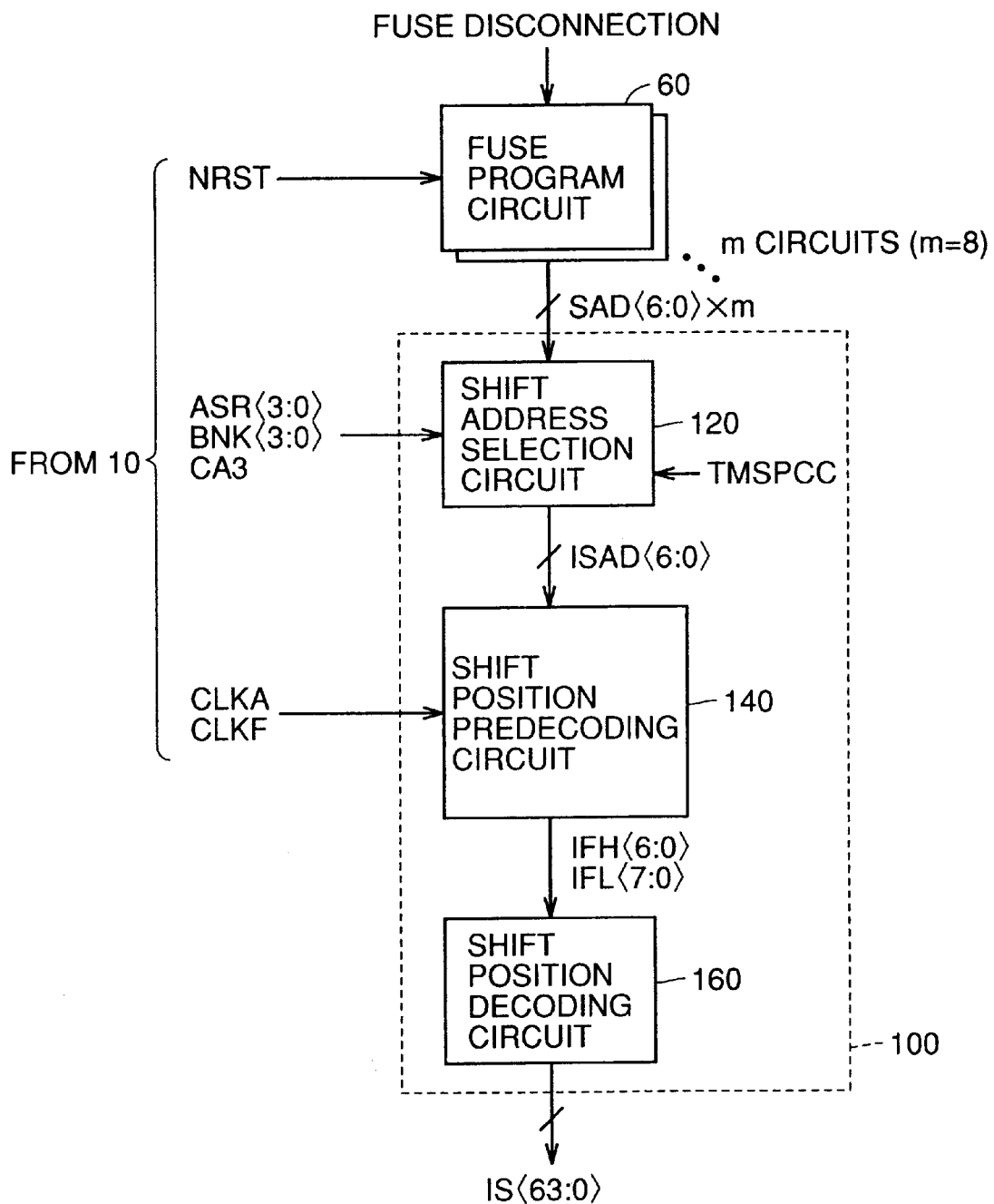
FIG. 5 is a block diagram showing a configuration of a fuse program circuit 60 and a shift control circuit 100.

Referring to FIG. 5, the fuse program circuits 60 are provided for each memory block in the normal memory array part 40 described in FIG. 2. Namely, m=8 in this embodiment.

Each fuse program circuit 60 has a plurality of fuse elements for storing the shift address for designating the shift position in the inside thereof in a non-volatile manner. Each fuse element can be blown off or disconnected by an input from the outside. For example, the fuse cutting process can be carried out by application of a high-voltage signal or a laser.

Each fuse program circuit 60 generates shift address signals SAD<6:0> corresponding to the presence or absence of the disconnection in each fuse element in correspondence with the activation of the shift reset signal NRST. The reading operation or the writing operation of the shift reset signal NRST is executed by the control circuit 10, and the shift reset signal NRST is activated in a pulse-like manner every time the memory cell is accessed. In correspondence with the activation of the shift reset signal, m shift address signals SAD<6:0> in total are output to the shift control circuit 100 by the m fuse program circuits.

The shift control circuit 100 includes a shift address selection circuit 120 that selectively outputs a shift address signal corresponding to the memory block constituting an object of access as ISAD<6:0> by receiving the m shift address signals SAD<6:0> output from the fuse program circuit 60 and the address signals ASR<3:0>, BNK<3:0>, CA3 for designating the memory block constituting the object of access in the normal memory array 40, a shift position predecoding circuit 140 that generates predecoding signals IFH<6:0> and IFL<7:0> by predecoding the shift address signals ISAD<6:0>, and a shift position decoding circuit 160 that determines the signal level of the shift setting signals IS<63:0> in correspondence with the predecoding signals IFH<6:0> and IFL<7:0>.

The shift address selection circuit 120 receives the control signals ASR<3:0> and BNK<3:0> that are set for each row block and the column address bit CA3 constituting one bit of the column address signal.

The signals ASR<3:0> are signals that are activated in the row block in which the row operation is activated, and the signals BNK<3:0> are signals that are activated in the row block constituting the object of the reading/writing operation. The column address bit CA3 designates, for example, either one of the even-numbered columns/odd-numbered columns in the memory cell columns By the group of these signals, one of the eight memory blocks obtained by division of the normal array 40 into 4 (row direction)×2 (column direction) can be selected.

The shift address selection circuit 120 selects one of the m shift address signals and outputs it as the ISAD<6:0> in correspondence with these address control signals received from the control circuit 10.

The shift position predecoding circuit 140 predecodes the shift address signals ISAD<6:0> received from the shift address selection circuit 120, and generates the predecoding signals IFH<6:0> and IFL<7:0> at the timing that follows a clock signal CLKA and a timing control signal CLKF given from the control circuit 10.

The shift position decoding circuit 160 sets the connection direction at each shift switch to be switched at the shift position by setting each signal level of the shift setting signals IS<63:0> on the basis of the predecoding signals IFH<6:0> and IFL<7:0>.

Here, in the following description, each bit in the shift address signal is also referred to as a shift address bit, and each bit in the predecoding signal is also referred to as a predecoding bit.

Figure 6:
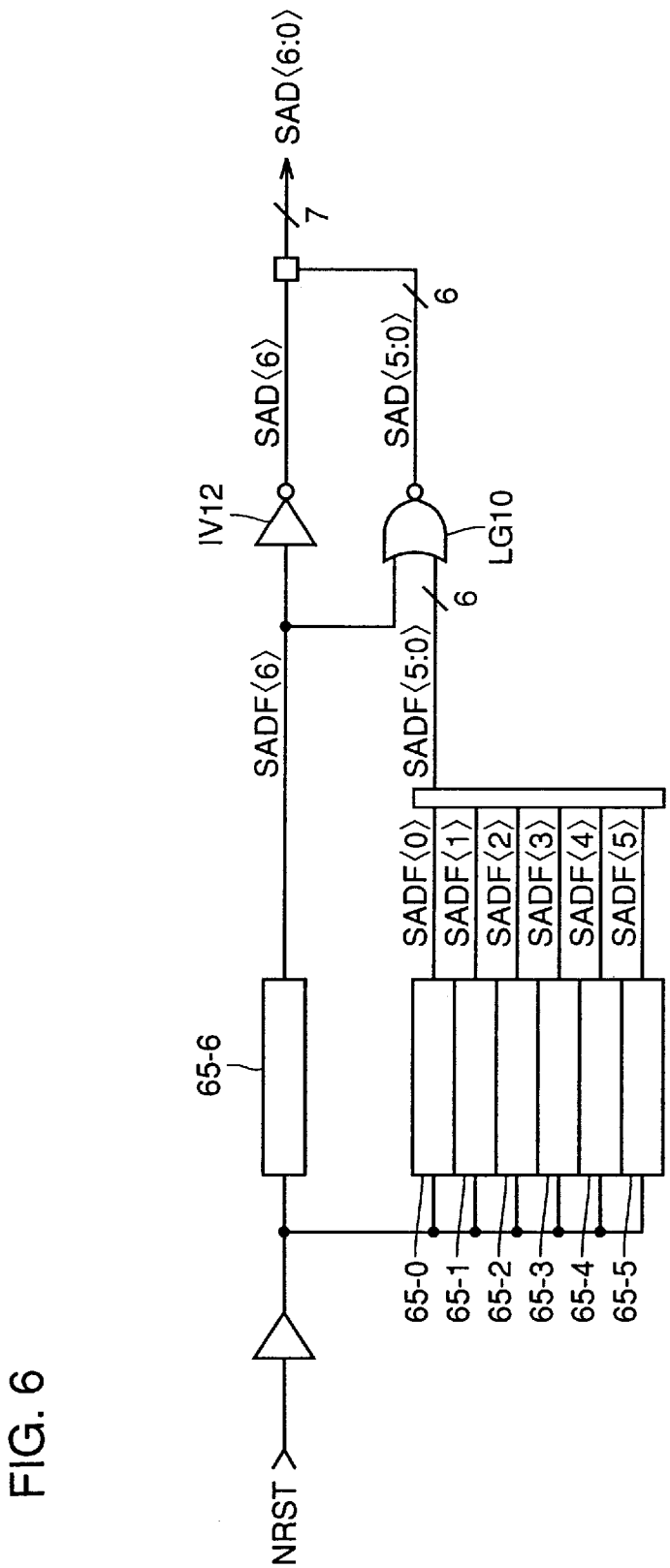
FIG. 6 is a block diagram showing a configuration of the fuse program circuit 60.

Referring to FIG. 6, the fuse program circuit 60 has fuse unit circuits 65-0 to 65-6 that output signal levels corresponding to the presence or absence of the cut in the fuse elements held in the inside in response to the shift reset signal NRST.

The fuse unit circuits 65-0 to 65-2 store the shift addresses for generating the upper predecoding signal. The fuse unit circuits 65-3 to 65-5 store the shift addresses for generating the lower predecoding signal. Into the fuse unit circuits 65-6 is programmed presence or absence of the execution of the redundancy relief using the spare memory array part at the time of access to the corresponding memory block.

Figure 7:
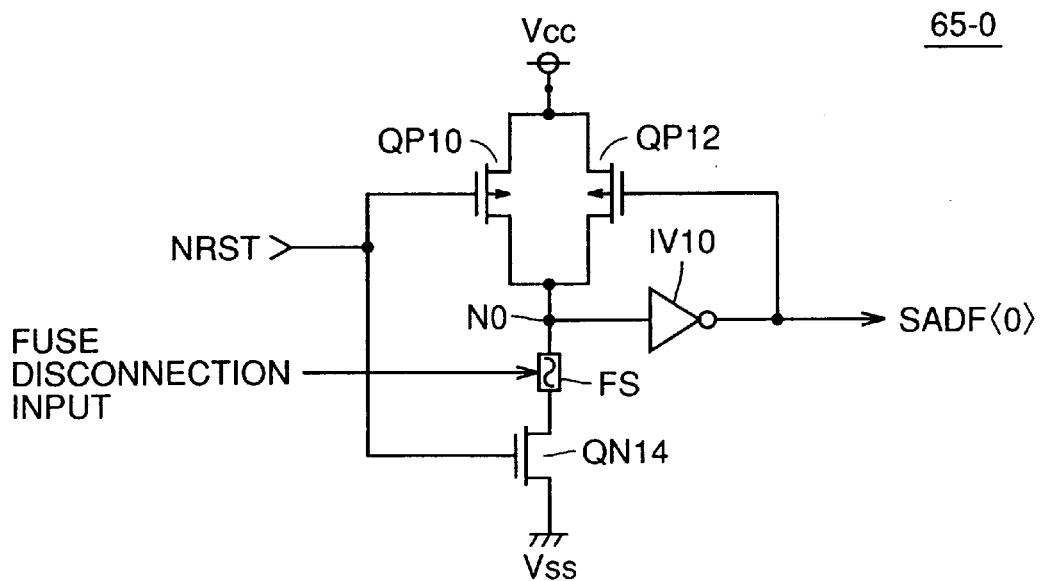
FIG. 7 is a circuit diagram showing a configuration of a fuse unit circuit.

Since each of the fuse unit circuits 65-0 to 65-6 has a similar configuration, FIG. 7 representatively shows a configuration of the fuse unit circuit 65-0.

Referring to FIG. 7, the fuse unit circuit 65-0 has P-type MOS transistors QP10 and QP12 that are connected in parallel between a power supply node (Vcc) and an internal node NO, a fuse element FS and an N-type MOS transistor QN14 that are connected in series between the internal node NO and a ground node (Vss), and an inverter IV10 that inverts the signal state of the internal node NO.

The inverter IV10 outputs SADF<0> having a signal level corresponding to the presence or absence of the blowing-off or disconnection in the fuse element FS. The shift reset signal NRST is input into the gates of the transistors QP10 and QN14, and the output node of the inverter IV10 is coupled to the gate of the transistor QP12.

Figure 8:
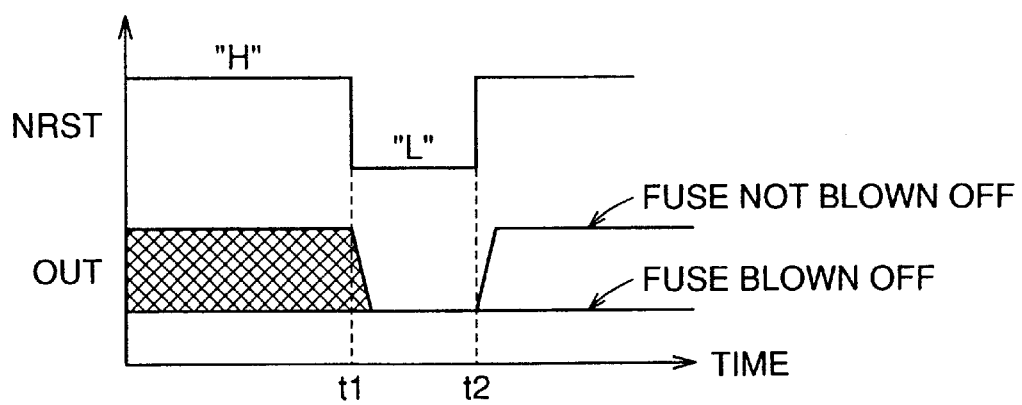
FIG. 8 is a waveform diagram illustrating an output signal level of the fuse unit circuit.

The output signal level of the fuse unit circuit will be described with the use of FIG. 8. Referring to FIG. 8, when the shift reset signal NRST is activated and changed to the L-level at the time t1, the transistor QP14 is turned off, and the transistor QP10 is turned on. This allows the internal node NO to be connected to the power supply node, and the output signal SADF<0> is set at the L-level. This allows the transistor QP12 to be turned on as well, and the L-level of the signal SADF<0> is latched.

Next, when the shift reset signal NRST changes from the L-level to the H-level at the time t2, the on/off of the transistor QP10 and the transistor QN14 changes from one to the other, whereby the signal level of the output signal SADF<0> is set in accordance with the presence or absence of the disconnection of the fuse element FS.

If the fuse element FS is blown off, the internal node NO is not connected to the ground node even if the transistor QN14 is turned on. This allows the signal level of the output signal SADF<0> to maintain the L-level in the same manner as at the time of activation of the shift reset signal NRST. This L-level is latched by turning-on of the transistor QP12.

On the other hand, if the fuse element FS is not blown off, the internal node N0 and the ground node are connected in accordance with the return of the shift reset signal NRST to the H-level. Thus the output of the inverter IV10 is inverted, and the signal level of the output signal SADF<0> changes to the H-level. This H-level is held while the signal level of the shift reset signal NRST is at the H-level.

Thus, by activating the shift reset signal NRST in a pulse-like manner at the access start time of the reading operation/writing operation, the output signal level corresponding to the presence or absence of the disconnection of the fuse element can be maintained during the aforesaid access operations.

Referring again to FIG. 6, the fuse program circuit 60 further includes an inverter IV12 that inverts the output signal SADF<6> of the fuse unit circuit 65-6, and a logic gate LG10 for executing an NOR operation between the output signal of the fuse unit circuit 60-6 and each of the output signals of the fuse unit circuits 60-0 to 65-5. The logic gate LG10 is a collective representation of six NOR gates that execute the NOR operation between the signal SADF<6> and each of the signals SADF<0> to SADF<5> as a single logic gate that outputs the 6-bit operation results.

The inverter IV12 generates one bit SAD<6> in the shift address signal. The shift address bit SAD<6> is a signal that indicates whether the redundancy relief is executed or not at the access time to the memory block corresponding to the fuse program circuit, and is set at the H-level if the redundancy relief is executed and set at the L-level if the redundancy relief is not executed If the redundancy relief is not executed at the access time to the corresponding memory block, the output signal SADF<6> of the fuse cut 65-6 is set at the H-level, so that all the bits in the SAD<5:0> among the shift address signals are set at the L-level. On the other hand, if the redundancy relief is to be executed, that is, if the shift of the I/O lines is to be executed, SAD<5:0> among the shift address signals is determined in accordance with the presence or absence of the cut to the fuse element in the fuse unit circuits 65-0 to 65-5.

Therefore, if the redundancy relief is not executed, all the bits in the shift address signal SAD<6:0> are set at the L-level, and in accordance therewith, the connection direction in all the shift switches is set at the normal side as described in FIG. 3, whereby the external I/O lines and the normal I/O lines are respectively connected.

On the other hand, if the redundancy relief is executed at the access time of the corresponding memory block, the shift address signal SAD<6:0> corresponding to the presence or absence of the cut to the fuse element is generated, so that the substitution and relief of the defective memory cell by shift redundancy is carried out by switching the connection direction of the shift switches to the spare side at the shift position designated by the shift address signal.

Figure 9:
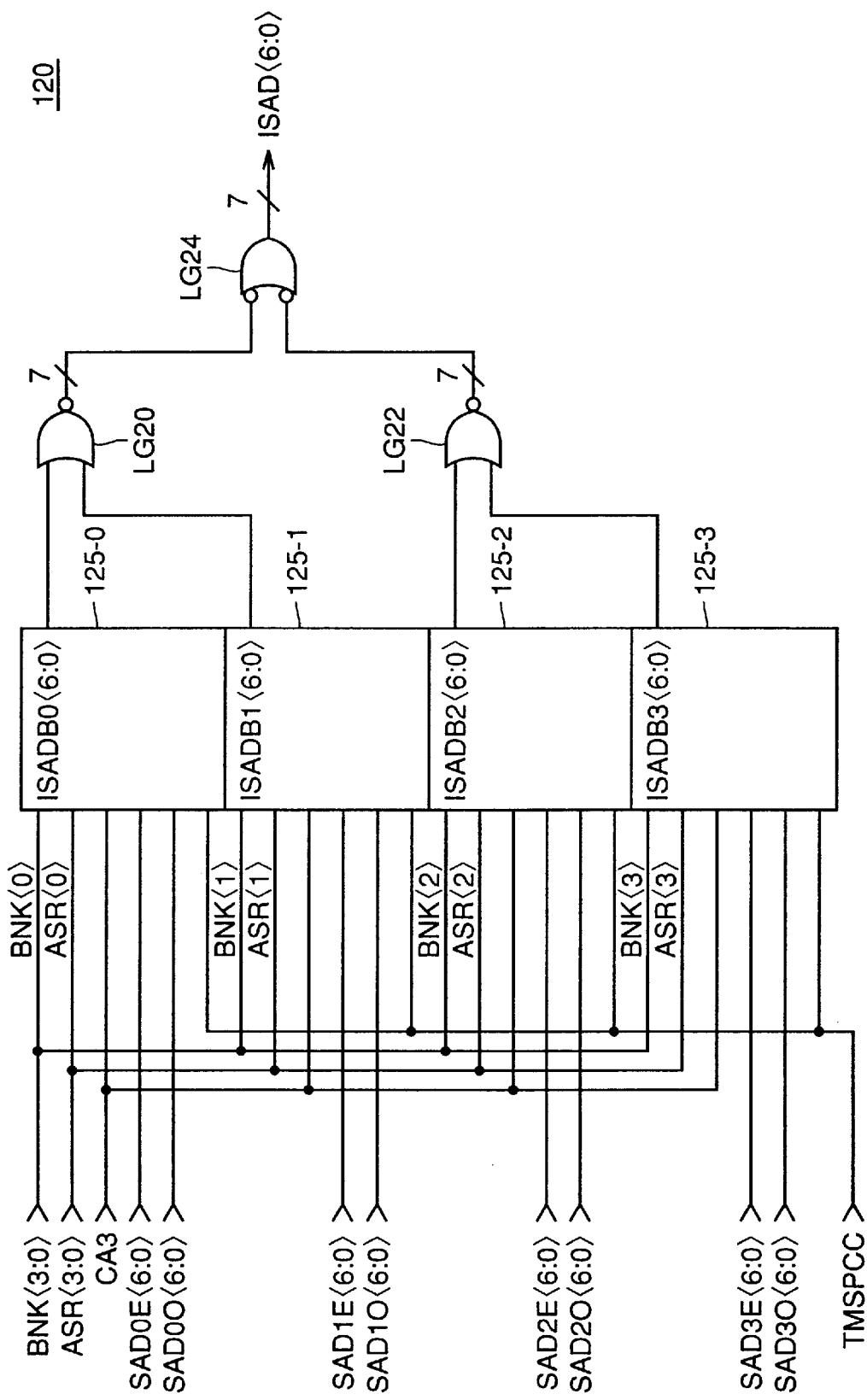
FIG. 9 is a block diagram showing a configuration of a shift address selection circuit 120.

Referring to FIG. 9, the shift address selection circuit 120 receives a group of signals ASR<3:0>, BNK<3:0>, and column address bit CA3 for designating one memory block constituting the object of access among the eight memory blocks in the normal memory array part, a plurality of shift address signals output by the respective fuse program circuits, and a shift test signal TMSPCC activated at the test operation time. The group of signals for specifying the memory block constituting the object of access is as described previously, so that their description will not be repeated.

The shift address signals output from the fuse program circuits 60 and corresponding to the respective memory blocks are represented as SAD0E, SAD0O to SAD3E, and SAD3O in accordance with the row block number, as well as whether the memory cell columns are the odd numbered ones (O) or the even numbered ones (E).

The shift address selection circuit 120 has selection units 125-0 to 125-3 provided for each row block.

Figure 10:
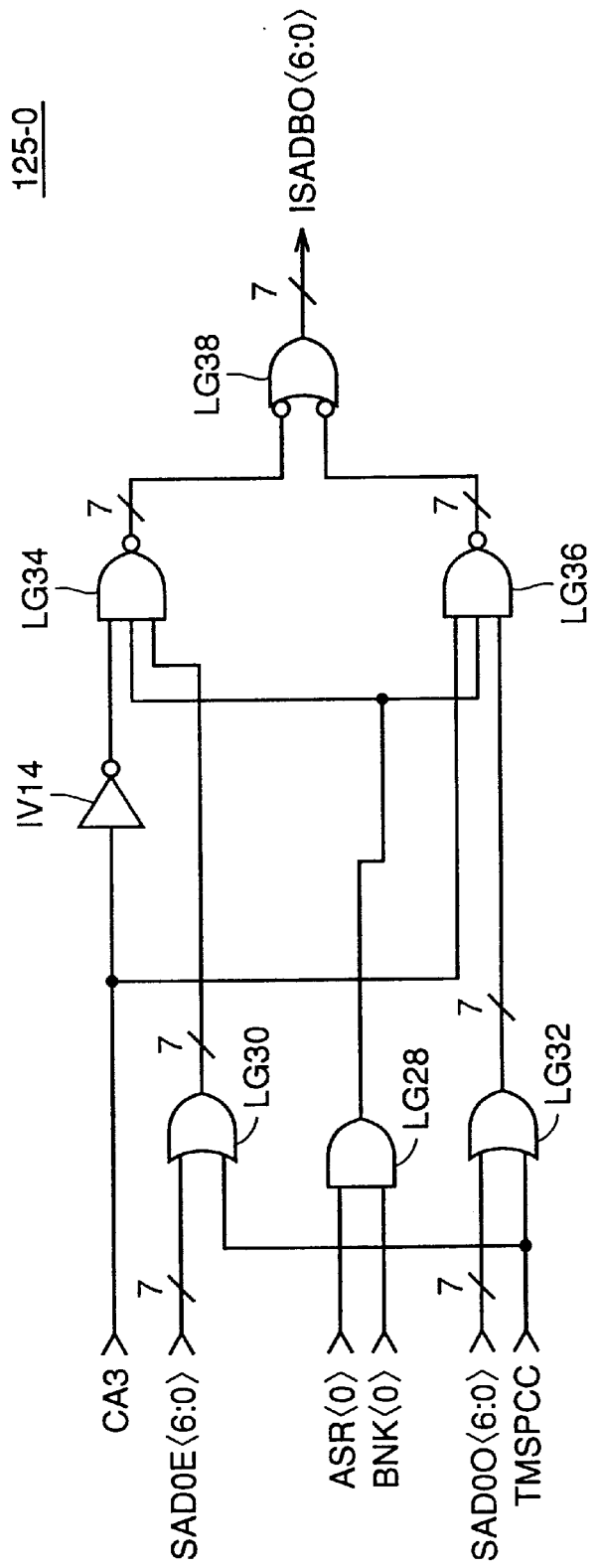
FIG. 10 is a circuit diagram showing a configuration of a selection unit.

Since the selection units 125-0 to 125-3 have a similar circuit configuration, FIG. 10 representatively shows a configuration of the selection unit 125-0.

Referring to FIG. 10, the selection unit 125-0 includes a logic gate LG28 that outputs an AND operation result of ASR<0> and BNK<0> corresponding to the row block RB0, a logic gate LG30 for executing an OR operation between the shift test signal TMBCC and each bit in the shift address signal SAD0E<6:0> corresponding to the even-numbered memory cell columns of the row block RB0, and a logic gate LG32 for executing an OR operation between the shift test signal TMBCC and each bit in the shift address signal SAD<6:0> corresponding to the odd-numbered memory cell columns of the row block RB0.

The logic gates LG30 and LG32 are each a collective representation of a plurality of OR gates respectively corresponding to plural bits as one logic gate in the same manner as the logic gate LG10 in FIG. 6. Each of the logic gates LG30 and LG32 outputs a 7-bit OR operation result.

The operation results output by the logic gates LG30 and LG32 are such that, if the shift test signal TMSPCC is activated (H-level), all the bits are forced to the H-level, and at ordinary times when the shift test signal TMSPCC is non-activated (L-level), a signal level in accordance with the shift address signals SAD0E<6:0> and SAD0O<6:0> is output.

The output signal of the logic gate LG28 is activated (H-level) if the row operation is activated in the row block RB0 and also the reading operation or the writing operation is instructed to allow the row block RB0 to be an object of access.

The selection unit 125-0 further includes an inverter IV14 that inverts the column address bit CA3, and a logic gate LG34 for outputting an NAND operation result in accordance with the output signals of the inverter IV14, the logic gate LG28, and the logic gate LG30. The selection unit 125-0 further includes a logic gate LG36 for outputting an NAND operation result in accordance with the column address bit CA3 and the output signals of the logic gates LG28 and LG32. The logic gates LG34 and LG36 are each a collective representation of seven NAND gates respectively corresponding to the 7-bit output signals output by the logic gates LG30 and LG32 in the same manner as the logic gates LG30 and LG32. Each of the logic gates LG34 and LG36 outputs a 7-bit NAND operation result.

The logic gate LG38 executes an OR operation respectively between the inverted signal of the 7-bit output signal of the logic gate LG30 and the inverted signal of the 7-bit output signal of the logic gate LG36. The logic gate LG38 also is a collective representation of seven logic gates as one logic gate, and outputs a 7-bit operation results as a selection result ISADB0<6:0> in the row block RB0.

If the row block RB0 is not an object of access, the output of the logic gate LG28 is at the L-level, so that the outputs of the logic gates LG34 and LG36 are at the H-level in all the bits. This allows all the bits in ISADB0<6:0> output by the selection unit 125-0 to be set at the L-level.

On the other hand, if the row block RB0 is an object of access, a corresponding shift address signal appears in either one of the logic gates LG34 and LG36 in accordance with the selection by the column address bit CA3, and the output of the other one is all set at the H-level. This allows ISADB0<6:0> output by the selection unit 125-0 to have the same signal level as the shift address signal corresponding to the memory block constituting the object of access.

The selection units 125-1 to 125-3 are provided in correspondence with the other row blocks RB1 to RB3, respectively, and if a memory block constituting an object of access is contained in the corresponding row block, they output a signal level of the shift address signal corresponding to the memory block constituting the object of access.

Referring again to FIG. 9, the shift address selection circuit 120 further includes a logic gate LG20 for executing an NOR operation between corresponding bits in ISADB0<6:0> and ISADB1<6:0> respectively output by the selection units 125-0 and 125-1, a logic gate LG22 for executing an NOR operation between corresponding bits in ISADB2<6:0> and ISADB3<6:0> respectively output by the selection units 125-2 and 125-3, and a logic gate LG24 for executing an OR operation between corresponding bits in the inverted signals of the output signals of the logic gates LG20 and LG22. The logic gates LG20, LG22, LG24 also are each a collective representation of seven logic gates as one logic gate, and output a 7-bit logic operation result.

By adopting this configuration, the shift address selection circuit 120 extracts a shift address signal corresponding to the memory block constituting the object of access from eight shift address signals SAD<6:0> output from the fuse program circuits 60, as ISAD<6:0>.

Figure 11:
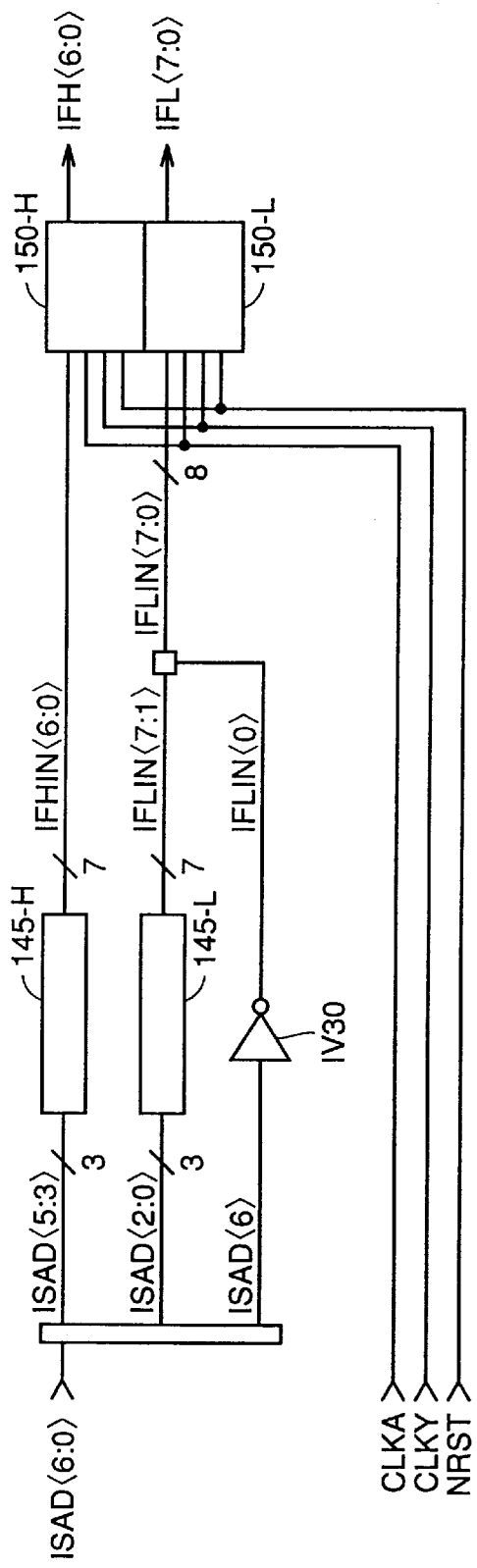
FIG. 11 is a block diagram showing a configuration of a shift position predecoding circuit 140.

Referring to FIG. 11, the shift position predecoding circuit 140 includes an inverter IV30 that inverts the shift address bit ISAD<6> for designating whether the redundancy relief is to be carried out or not, a predecoding unit 145-H for predecoding the shift address bit ISAD<5:3> for generating the upper predecoding signal, and a predecoding unit 145-L for predecoding the shift address bit ISAD<2:0> for generating the lower predecoding signal.

Each of the predecoding units 145-H and 145-L has a similar configuration, and outputs a 7-bit predecoding signal in response to the input 3-bit shift address.

Figure 12:
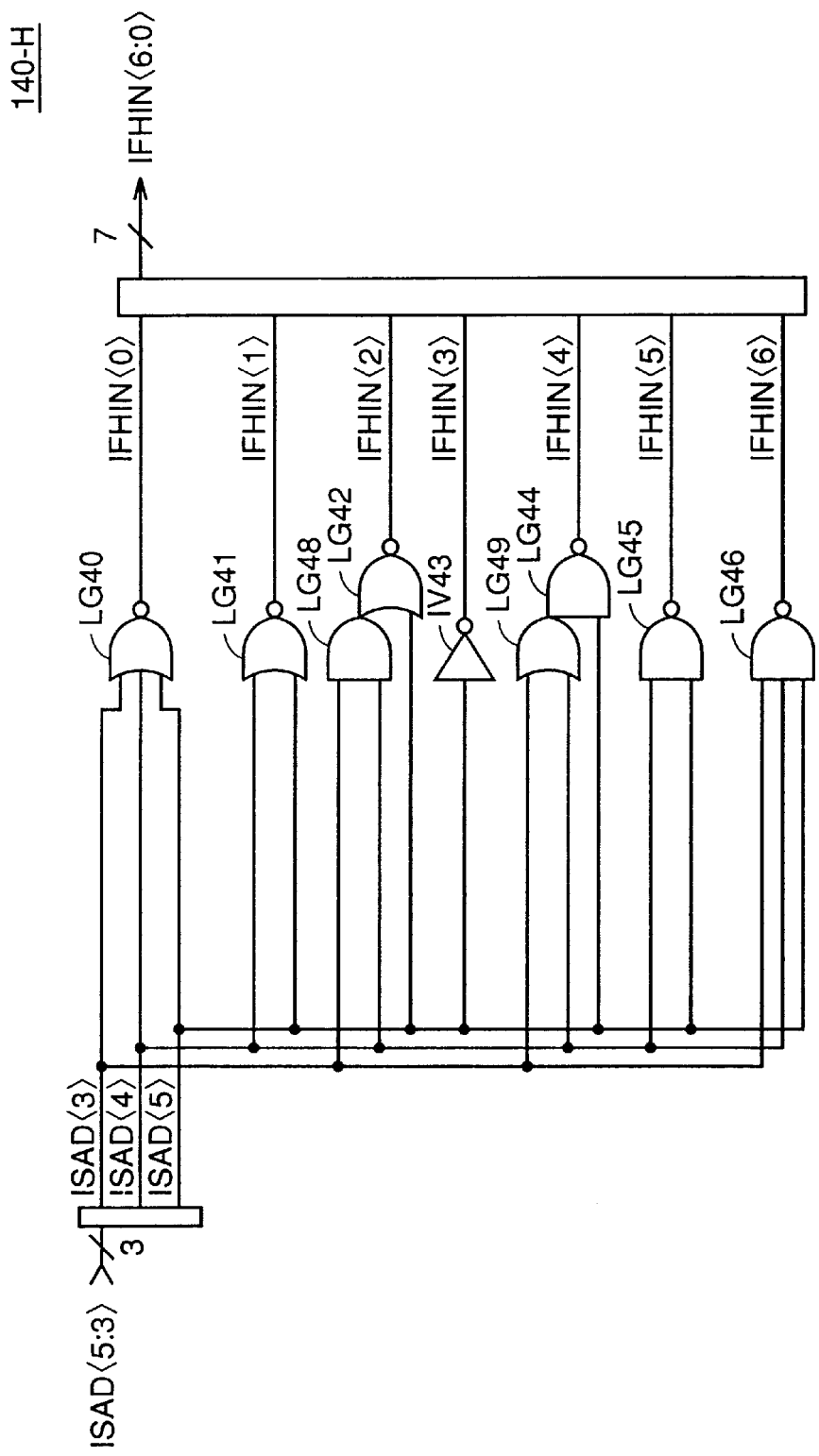
FIG. 12 is a circuit diagram showing a configuration of a predecoding unit.

FIG. 12 representatively shows a configuration of the predecoding unit 145-H.

Referring to FIG. 12, the predecoding units 145-H outputs a 7-bit predecoding signal IFHIN<6:0> by receiving the shift address bits ISAD<5>, ISAD<4>, and ISAD<3> as inputs.

The predecoding unit 145-H includes a logic gate LG40 that outputs a NOR operation result of the shift address bits ISAD<5>, ISAD<4>, and ISAD<3> as the predecoding bit IFHIN<0>, a logic gate LG41 that outputs a NOR operation result of the shift address bits ISAD<4> and ISAD<5> as the predecoding bit IFHIN<1>, a logic gate LG48 that outputs an AND operation result of the shift address bits ISAD<3> and ISAD<4>, a logic gate LG42 that outputs a NOR operation result of the output of the logic gate LG48 and the shift address bit ISAD<5> as the predecoding bit IFHIN<2>, and an inverter IV43 that outputs IFHIN<3> by inverting the shift address bit ISAD<5>.

The predecoding unit 145-H further includes a logic gate 49 that outputs an OR operation result of the shift address bits ISAD<3> and ISAD<4>, a logic gate LG44 that outputs a NAND operation result of the output of the logic gate LG49 and the shift address bit ISAD<5> as the decoding bit IFHIN<4>, a logic gate LG45 that outputs a NAND operation result of the shift address bits ISAD<4> and ISAD<5> as the decoding bit IFHIN<5>, and a logic gate LG46 that outputs a NAND operation result of the shift address bits ISAD<3>, ISAD<4>, and ISAD<5> as the decoding bit IFHIN<6>. The signal level of each bit in the predecoding signal IFHIN is set by these logic gates LG40 to LG46 and the inverter IV43.

FIG. 13 shows the signal level of each bit in the predecoding signal IFHIN<6:0> corresponding to a combination of the shift address bits ISAD<5>, ISAD<4>, and ISAD<3>.

As shown in FIG. 13, eight different predecoding signals for designating the shift position can be output in response to a combination of the 3-bit shift address bits. Namely, the shift position can be designated by the bit at which the signal level switches from "0" to "1".

The predecoding unit 140-L has a configuration similar to that of the predecoding unit 140-H, receives the shift address bits ISAD<2:0> respectively corresponding to the shift address bits ISAD<5:3> as inputs, and generates predecoding bits IFLIN<1> to IFLIN<7> respectively corresponding to the predecoding bits IFHIN<0> to IFHIN<6> in FIG. 12.

Referring again to FIG. 11, the predecoding bit IFLIN<0> output by the inverter IV30 and the predecoding bit IFLIN<7:1> output by the predecoding unit 140-L are combined to generate an 8-bit predecoding signal IFLIN<7:0>.

The predecoding signals IFH<6:0> and IFL<7:0> are given to the timing adjustment circuits 150-H and 150-L, respectively.

Figure 14:
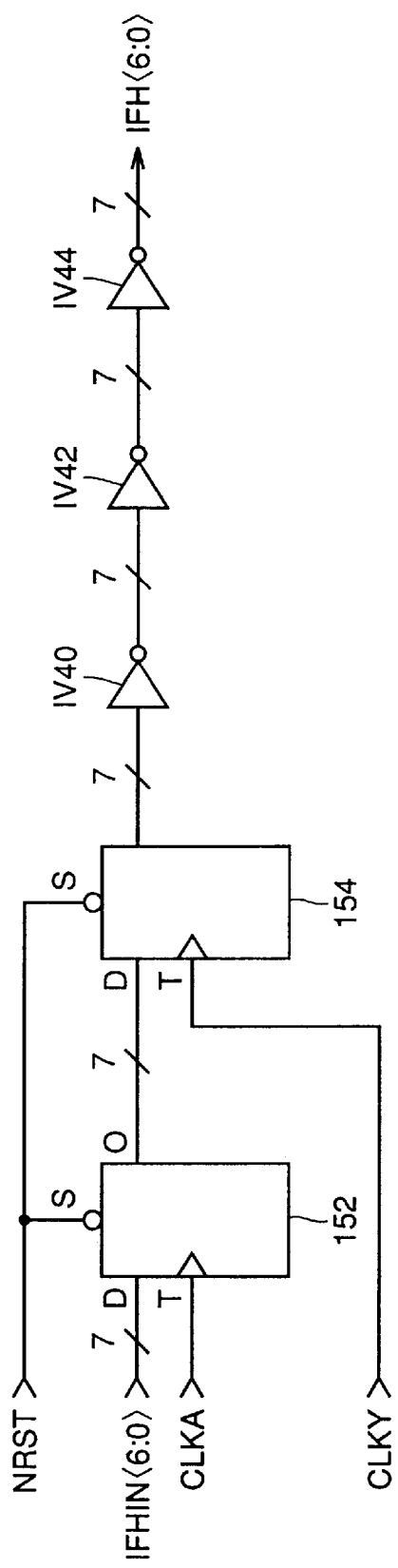
FIG. 14 is a circuit diagram showing a configuration of a timing adjustment circuit.

Since the timing adjustment circuits 150-H and 150-L have a similar circuit configuration, FIG. 14 representatively shows a circuit configuration of the timing adjustment circuit 150-H.

Referring to FIG. 14, the timing adjustment circuit 150-H includes a D-flip-flop 152 that operates using the clock signal CLKA as a trigger, a D-flip-flop 154 that operates using the output timing signal CLKY as a trigger, and inverters IV40, IV42, and IV44 that are connected in series to the output of the D-flip-flop 154.

The D-flip-flops 152 and 154 are brought into an operation state in accordance with the activation of the shift reset signal NRST, and transfers the predecoding signal IFHIN<6:0> respectively in accordance with the activation timing of the clock signal CLKA and the output timing signal CLKY generated by the control circuit 10.

This allows the D-flip-flop 152 to latch each bit of the predecoding signal in accordance with the clock signal CLKA and allows the D-flip-flop 154 to send the predecoding signal IFHIN<6:0> for supplying it to a circuit of a later stage at a predetermined timing corresponding to the output timing signal CLKY. The output timing signal CLKY is activated at a timing when a predetermined time needed for shift predecoding has passed after the start of access.

Each of the inverters IV40 to IV42 is a collective representation of seven inverters that execute the inversion operation for each bit in the 7-bit signal. The inverter IV44 outputs a predecoding signal IFH<6:0> for sending it to the shift position decoding circuit 160.

Here, this predecoding signal IFH<6:0> inverts the signal level of IFHIN<6:0> output from the predecoding unit. Therefore, in the case where all the fuse elements in the corresponding fuse box circuit 60 are not cut, each bit in the predecoding signal is set at the L-level ("0"). On the other hand, in the case where the shift test signal TMSPCC is activated (H-level), each bit in the predecoding signal is set at the H-level ("1").

The timing adjustment circuit 150-L also has a similar configuration, and inverts and transfers the signal level of the predecoding signal IFLIN<7:0> in accordance with the activation timing of the clock signal CLKA and the output timing signal CLKY generated by the control circuit 10.

Figure 15:
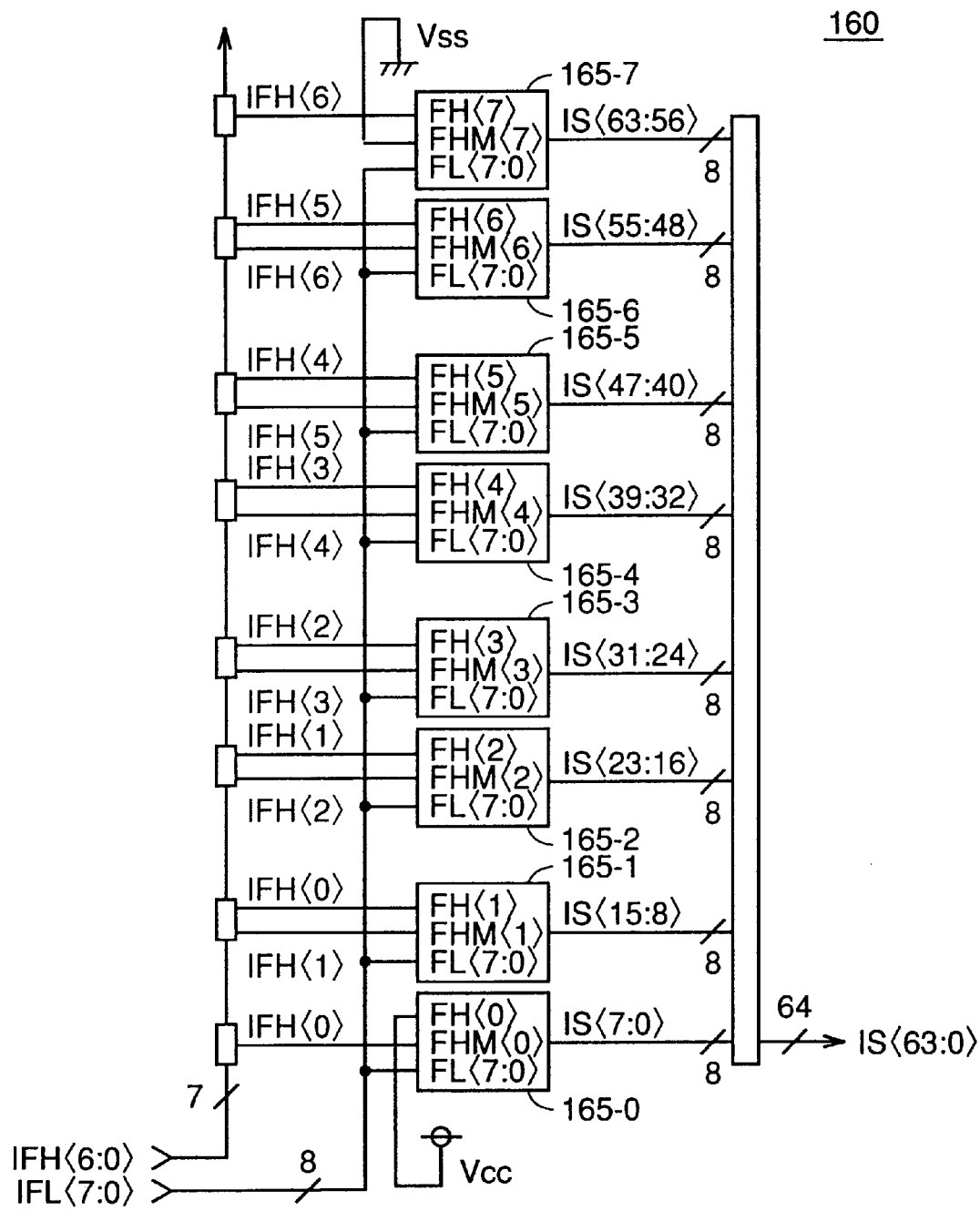
FIG. 15 is a block diagram showing a configuration of a shift position decoding circuit 160.

Referring to FIG. 15, the shift position decoding circuit 160 sets the signal level of each of the shift setting signals IS<63:0> by decoding the predecoding signals IFH<6:0> and IFL<7:0>.

The shift position decoding circuit 160 includes decoding circuits 165-i (i: integer from 0 to 7) disposed in correspondence with each shift switch group. The decoding circuit 165-i generates eight shift setting signals corresponding to the i-th shift switch group.

The decoding circuit 160-i executes decoding by receiving the upper predecoding bits FH<i> and FHM<i> set in correspondence with two bits in the predecoding signal IFH<6:0> and the lower predecoding signal FL<7:0> set in correspondence with the predecoding signal IFL<7:0>.

The upper predecoding bit FH<i> is fixed at the power supply voltage Vcc, i.e. H-level ("1"), in the foremost decoding circuit 165-0. In the other decoding circuits 165-i, the upper predecoding bit FH<i> is set so that FH<i>=IFH<i−1>(i=1 to 7).

The predecoding bit FHM<i> is fixed at the ground voltage Vss, i.e. L-level ("0"), in the last decoding circuit 165-7. In the other decoding circuits 165-i, the predecoding bit FHM<i> is set so that FH<i>=IFH<i>(i=0 to 6). In other words, the predecoding bit FHM<i> has the same signal level as the upper predecoding bit FH<i> on the side shifted upwards by one bit.

The lower predecoding signals FL<7:0> have the same signal level as the predecoding signals IFL<7:0>, respectively.

Figure 16:
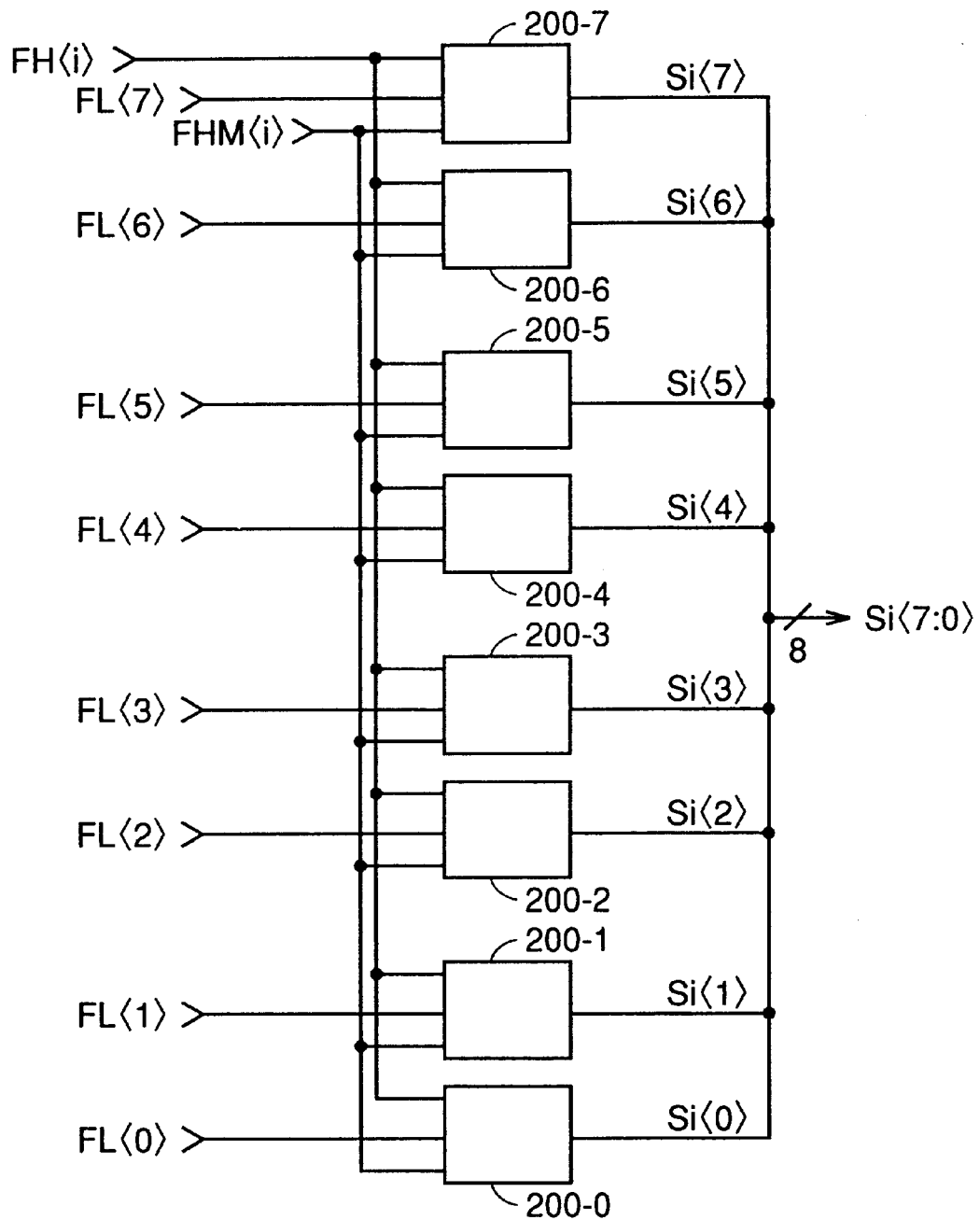
FIG. 16 is a block diagram describing a configuration of a decoding circuit.

Referring to FIG. 16, the decoding circuit 165-i includes decoding units 200-0 to 200-7 disposed respectively in correspondence with each bit in the lower predecoding signal FL<7:0>.

The upper predecoding bits FH<i> and FHM<i> corresponding to the i-th shift switch group is given commonly to the decoding units 200-0 to 200-7.

Each decoding unit 200-j (j: integer from 0 to 7) outputs a shift setting signal Si<j>.

Figure 17:
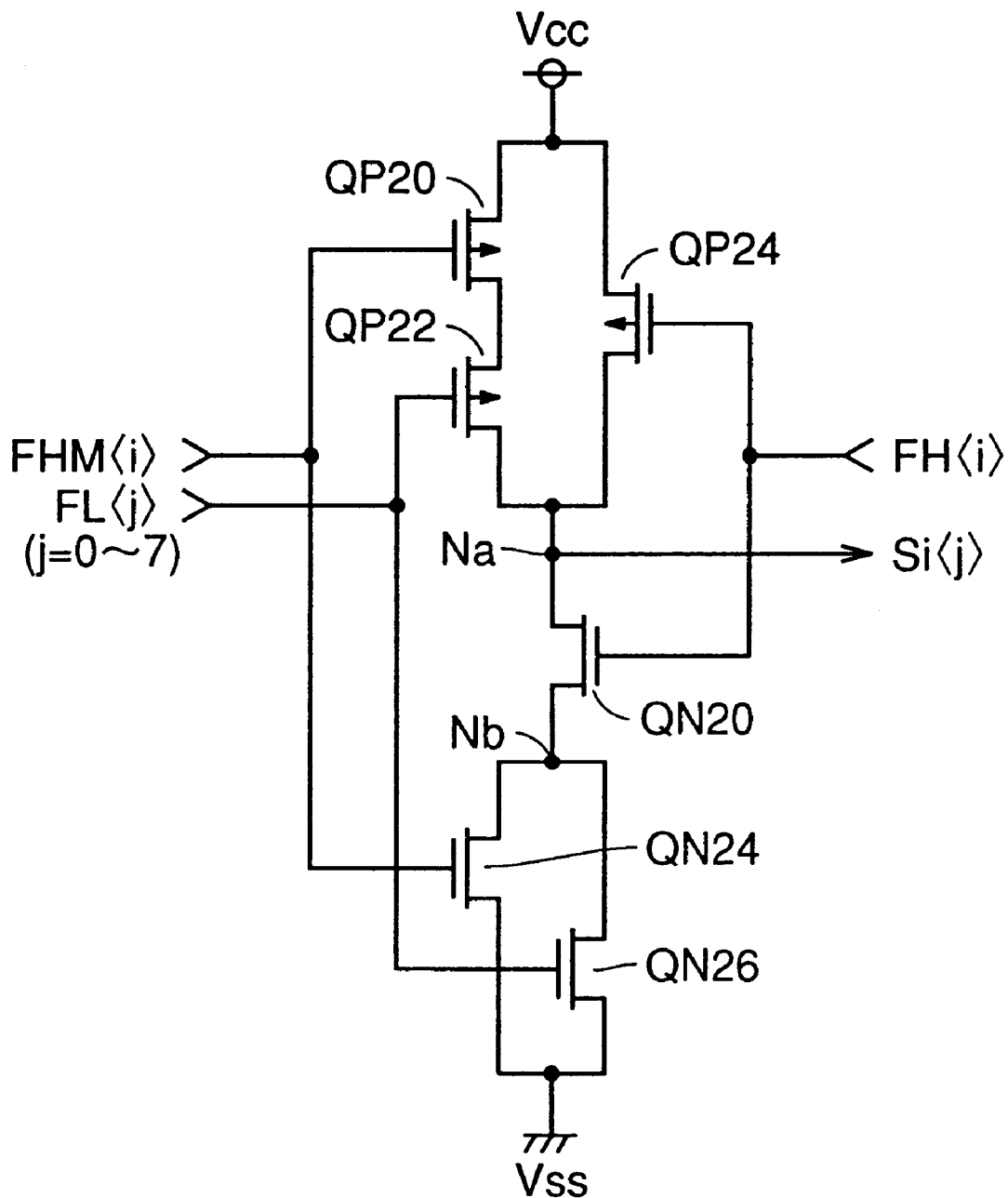
FIG. 17 is a circuit diagram showing a configuration of a decoding unit.
Figure 19A:
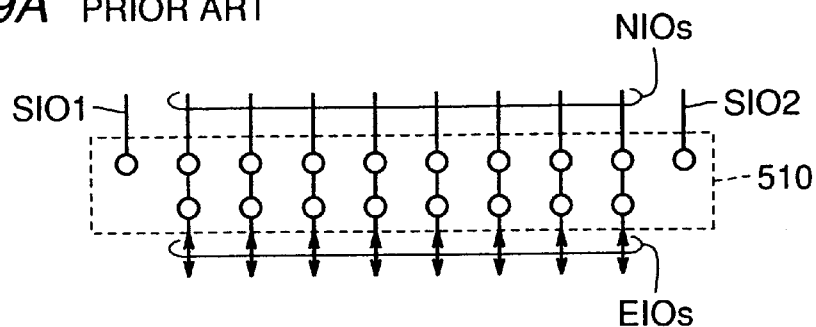
FIGS. 19A and 19B are schematic illustrations related to the substitution of a defective memory cell by the shift redundancy method.
Figure 19B:
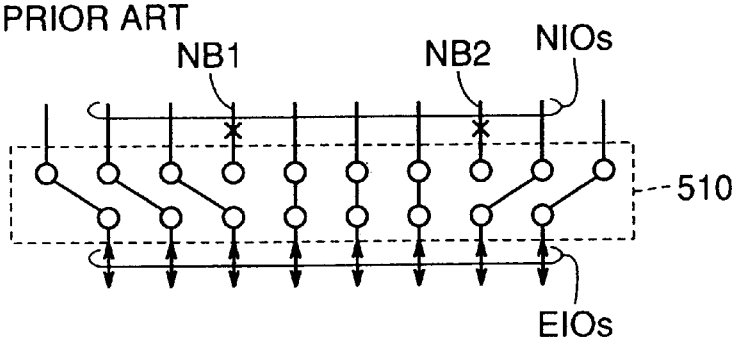
Figure 20:
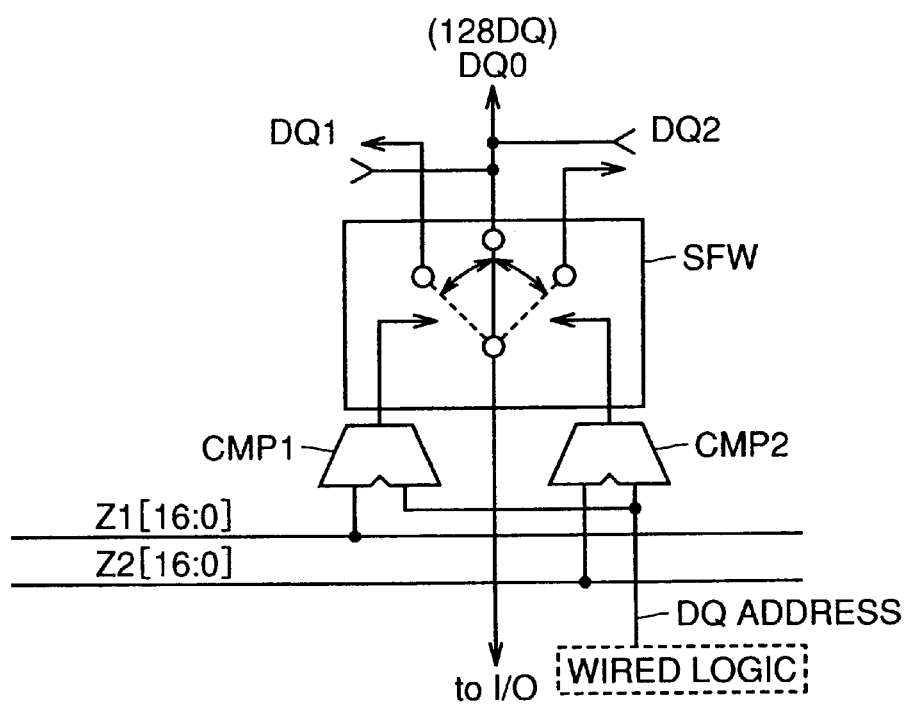
FIG. 20 is a view for describing the control of a shift switch in the shift redundancy method according to the prior art.

FIG. 17 shows a configuration of the decoding unit 200-j disposed in correspondence with the i-th shift switch group.

Referring to FIG. 17, the decoding unit 200-j includes P-type MOS transistors QP20 and QP22 that are coupled in series between the power supply node that supplies the power supply voltage Vcc and the node Na that generates the shift setting signal Si<j>, and a P-type MOS transistor QP24 that is coupled between the power supply node and the node Na in parallel with the transistors QP20 and QP22.

The decoding unit 200-j further includes an N-type MOS transistor QN20 that is coupled between the node Na and the node Nb, and N-type MOS transistors QN24 and QN26 that are connected in parallel with each other between the node Nb and the ground node for supplying the ground voltage Vss.

The upper predecoding bit FH<i> is given to the gates of the transistors QN20 and QP24. The predecoding bit FHM<i> is given to the gates of the transistors QP20 and QN24. The corresponding j-th lower predecoding bit FL<j> is given to the gates of the transistors QN26 and QP22.

Therefore, if the upper predecoding bit FH<i> is at the L-level ("0"), the shift setting signal Si<j> is set at the H-level ("1") by turning-on of the transistor QP24 irrespective of the signal level of the lower predecoding bit FL<j>.

On the other hand, if the upper predecoding bit FH<i> is at the H-level ("1") and FHM<i> is at the L-level ("0"), i.e. if the i-th shift switch group corresponds to the shift position, the transistors QP20 and QN20 are turned on and the transistors QP24 and QN24 are turned off.

In this case, therefore, the shift setting signal Si<j> is set at the H-level ("1") by turning-on of the transistor QP22 when the lower predecoding bit FL<j> is at the L-level ("0"), and the shift setting signal Si<j> is set at the L-level ("0") by turning-on of the transistors QN26 when the lower predecoding bit FL<j> is at the H-level ("1").

Therefore, by adopting a configuration shown in FIG. 17, the shift setting signal Si<j> is set at the H-level ("1") in the case where "the upper predecoding bit FH<i>=L-level ("0")" or in the case where "the upper predecoding bit FH<i>=H-level ("1"), FHM<i>=L-level ("0"), and the lower predecoding bit FL<j>=L-level" in the corresponding i-th shift switch group.

In the other cases, the shift setting signal Si<j> is set at the L-level ("0"). As a result, the signal level of the shift setting signal is divided into two in correspondence with the bit at which the signal level is switched in the upper predecoding signal and the lower predecoding signal, whereby the redundancy relief according to the shift redundancy method can be carried out by switching the connection direction of each shift switch at the shift position designated by the shift address bit.

Next, with reference to FIG. 18, the decoding of the shift position and the connection direction of each shift switch will be described.

Referring to FIG. 18, the shift setting signals IS<0> to IS<63> respectively corresponding to the external I/O lines EIO0 to EIO63 are respectively set by each bit in the upper predecoding signal FH and the lower predecoding signal FL. In the example shown in FIG. 18, FH<O> to FH<2>="1" and FH<3>="0" and the signal level of the predecoding signal is switched here, so that the shift switch corresponding to the shift position is contained in the shift switch group corresponding to FH<2>. This can be detected by checking the signal levels of the upper predecoding bits FH<i> and FHM<i> in the i-th shift switch group.

Further, since the lower predecoding signal FL<7:0> designates that the connection mode is switched at the fourth shift switch in the shift switch group, the shift setting signals IS<0> to IS<19> are set at the L-level ("0"), and the shift setting signals IS<20> to IS<63> are set at the H-level ("1").

This allows the connection direction in the shift switches SW0 to SW19 to be set at the spare side described in FIG. 3, and the connection direction in the shift switches SW20 to SW63 are set at the normal side. In this case, the region corresponding to the 20th normal I/O line NIO19 includes a defective memory cell, and the shift address for designating this is held in the fuse program circuit 60.

Thus, in the case of controlling the connection direction of the shift switch on the basis of the setting of the shift position in the redundancy relief by the shift redundancy method, the scale of the decoding circuit can be reduced by dividing the shift switches into a plurality of shift switch groups each having the same number of shift switches and by hierarchically designating the aforesaid shift position with the use of the shift address programmed in the fuse element.

As shown in FIG. 17, according to the embodiment of the present invention, the decoding circuit provided in correspondence with each shift switch can be constructed with six MOS transistors. This makes it possible to carry out the redundancy relief by the shift redundancy method without inviting a considerable increase in the circuit scale even in the memory cell array configuration in which numerous data I/O lines are disposed.

Here, this embodiment shows a configuration in which the spare memory array part 45 is disposed on the left side (control circuit 10 and WL/CSL driving circuit 20 side) of the normal memory array part 40 in FIG. 1. However, it is possible to adopt a configuration in which the spare memory array part 45 is disposed in the region on the opposite side. This case gives rise to a configuration in which the spare I/O line SIO is disposed on the rightmost side in FIG. 3, so that the definition of the connection direction (spare side/normal side) in each shift switch and others may be changed in correspondence therewith.

Further, it is possible to adopt a configuration in which the spare memory array part 45 is disposed on both sides of the normal memory array part 40. In this case, the circuit group and the I/O line shift circuits 50 for designating the shift position may be independently provided in correspondence with each of the spare memory array parts 45 disposed on the left side and on the right side, and these I/O line shift circuits 50 may be disposed in series between the internal I/O lines and the external I/O lines so that the shift can be carried out in two stages.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a memory cell array including a normal memory array part and a spare array part disposed adjacent to said normal memory array part for substitution of a defective part in said normal memory array;

a plurality of internal data lines for transmitting data input and output to and from said memory cell array part, said plurality of internal data lines including a plurality of normal data lines from first one to M-th one (M: natural number) disposed in correspondence with said normal memory array part, and a spare data line disposed in correspondence with said spare array part;

a plurality of external data lines from first one to M-th one that are capable of giving and receiving said data to and from an outside;

a plurality of shift switches from first one to M-th one, each of which is disposed between adjacent two lines among said plurality of internal data lines in correspondence with each of said plurality of external data lines, each of said shift switches connecting a corresponding one of said external data lines to either one of said adjacent two internal data lines in accordance with an instructed connection direction;

a shift control circuit that sets said connection direction of each of said shift switches on the basis of information on a shift position stored in advance in executing the substitution of the defective part by said spare array part; and said shift control circuit including a shift position predecoding circuit that generates a first predecoding signal for designating one group containing a shift switch corresponding to said shift position among L groups (L: natural number represented by M/N) formed by dividing said M shift switches into groups each containing N switches (N: natural number being a divisor of M and smaller than M) and a second predecoding signal commonly provided for each of said groups and designating the N'-th one (N': natural number from 1 to N) of N shift switches belonging to the same one of said groups, and a shift position decoding circuit that sets said connection direction of each of said shift switches on the basis of said first and second predecoding signals.

2. The semiconductor memory device according to claim 1, wherein said normal memory array part is divided into a plurality of memory blocks having said plurality of normal data lines in common;

said semiconductor memory device further comprises a plurality of fuse program circuits disposed respectively in correspondence with said plurality of memory blocks, each of said plurality of fuse program circuits holding a substitution presence/absence bit that designates use or non-use of said spare array part at an access time to said corresponding memory block and a shift address having a plurality of bits for designating said shift position at the time of use of said spare array part, and said shift control circuit further includes a shift address selection circuit that receives said shift address output by each of the plurality of fuse program circuits and selectively outputs the shift address corresponding to one memory block constituting an object of access among said plurality of memory blocks; and said shift position predecoding circuit generates said first and second predecoding signals on the basis of a shift address output by said shift address selection circuit.

3. The semiconductor memory device according to claim 2, wherein each bit of said shift address has a first signal level and a second signal level; and said shift address selection circuit sets all the bits of said shift address to be at said first signal level if the non-use of said spare array part is programmed in said memory block constituting an object of access, and sets a signal level of each bit of said shift address on the basis of said shift address held in one fuse program circuit corresponding to said memory block constituting an object of access among said plurality of fuse program circuits if the use of said spare array part is programmed.

4. The semiconductor memory device according to claim 3, wherein said shift address selection circuit further receives a test control signal for testing a shift operation, and sets all the bits of said shift address to be at said second signal level at a time of activation of said test control signal.

5. The semiconductor memory device according to claim 2, wherein each of said plurality of fuse program circuits is provided for storing said shift address in a non-volatile manner, and has a fuse element capable of being fused by an input from outside.

6. The semiconductor memory device according to claim 1, wherein said spare data line is disposed adjacent to the first one of said normal data lines;

the K-th shift switch (K: natural number from 1 to M) is designated to be said shift position if said defective part is present in a region corresponding to the K-th one of said normal data lines; and said shift control circuit sets said connection direction at each of said shift switches from the first one to the K-th one to be a first direction that connects the corresponding one of said external data lines with one of said adjacent two internal data lines on the side near to said spare data line, and sets said connection direction at each of said shift switches from the (K+1)-th one to the M-th one to be a second direction that connects the corresponding one of said external data lines with one of said adjacent two internal data lines on the side far from said spare data line.

7. The semiconductor memory device according to claim 6, wherein said shift control circuit sets said connection direction at all of said shift switches to be said second direction if the non-use of said spare array part is programmed in said memory block constituting an object of access.

8. The semiconductor memory device according to claim 6, wherein said shift control circuit further receives a test control signal for testing a shift operation, and sets said connection direction of all of said shift switches to be said first direction at a time of activation of said test control signal.

9. The semiconductor memory device according to claim 1, wherein said first predecoding signal has L bits respectively corresponding to said L groups;

said second predecoding signal has N bits respectively corresponding to N shift switches belonging to said same group;

said shift position predecoding circuit respectively sets first bit to L'-th bit (L': natural number from 1 to L) of said first predecoding signal and the rest of the bits to be at different signal levels if the shift switch corresponding to said shift position belongs to the L'-th one of said groups; and said shift position predecoding circuit respectively sets the first bit to N'-th bit (N': natural number from 1 to N) of said second predecoding signal and the rest of the bits to be at different signal levels if the shift switch corresponding to said shift position is the N'-th one in said group.

10. The semiconductor memory device according to claim 9, wherein said shift position decoding circuit includes M decoding units respectively provided in correspondence with said M shift switches, each of said M decoding units generating a shift control signal for designating said connection direction at a corresponding one of said M shift switches, one of said decoding units corresponding to the J-th one (J: natural number from 1 to N) of said shift switches in the I-th group (I: natural number from 1 to L) having:

a first node that generates said shift control signal, a first transistor coupled between a first power supply node that supplies a voltage corresponding to a first signal level and said first node, second and third transistors coupled in parallel with said first transistor and in series between said first power supply node and said first node, a fourth transistor coupled between said first node and a second node, and fifth and sixth transistors coupled in parallel between a second power supply node that supplies a voltage corresponding to a second signal level and said second node, said first and fourth transistors complementarily turning on/off in accordance with a signal level of the I-th bit of said first predecoding signal, said second and fifth transistors complementarily turning on/off in accordance with a signal level of the (I+1)-th bit of said first predecoding signal, said third and sixth transistors complementarily turning on/off in accordance with a signal level of the J-th bit of said second predecoding signal, and said second transistor in said second and fifth transistors being always turned on if I is equal to L.

11. The semiconductor memory device according to claim 10, wherein said spare data line is disposed adjacent to the first one of said normal data lines;

said connection direction at each of said data shift line switches in which the corresponding shift control signal has said first signal level is set to be a direction that connects the corresponding one of said external data lines with one of said adjacent two internal data lines on the side near to said spare data line; and said connection direction at each of said data shift line switches in which the corresponding shift control signal has said second signal level is set to be a direction that connects the corresponding one of said external data lines with one of said adjacent two internal data lines on the side far from said spare data line.

* * * * *